United States Patent
Fan

(10) Patent No.: US 8,336,719 B2
(45) Date of Patent: Dec. 25, 2012

(54) RACK FRAME

(75) Inventor: Chen-Lu Fan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 126 days.

(21) Appl. No.: 12/956,654

(22) Filed: Nov. 30, 2010

(65) Prior Publication Data

US 2012/0018397 A1   Jan. 26, 2012

(30) Foreign Application Priority Data

Jul. 26, 2010   (CN) .......................... 2010 1 0236792

(51) Int. Cl.
*A47F 7/00* (2006.01)
*A47G 29/00* (2006.01)
*B62B 5/04* (2006.01)

(52) U.S. Cl. ...... 211/26; 211/13.1; 211/189; 312/265.4; 280/79.3

(58) Field of Classification Search .................... 211/26, 211/182, 183, 189, 190, 191, 192, 193; 280/79.11, 280/79.3; 312/223.1, 265.1, 265.2, 265.3, 312/265.4; 361/724, 725, 726, 727; 248/500, 248/506, 680

See application file for complete search history.

(56) References Cited

U.S. PATENT DOCUMENTS

| | | | |
|---|---|---|---|
| 4,715,502 A * | 12/1987 | Salmon ........................... 211/26 |
| 5,535,898 A * | 7/1996 | Burgess et al. ............... 211/206 |
| 6,279,756 B1 * | 8/2001 | Walter et al. .................... 211/26 |
| 6,315,263 B1 * | 11/2001 | Wang ............................ 248/694 |
| 6,321,917 B1 * | 11/2001 | Mendoza ....................... 211/26 |
| 6,349,837 B1 * | 2/2002 | Serban .......................... 211/26 |
| 6,636,418 B1 * | 10/2003 | Claprood et al. ............. 361/600 |
| 6,889,853 B2 * | 5/2005 | Hudz et al. .................... 211/26 |
| 7,219,809 B2 * | 5/2007 | Schluter et al. .............. 211/189 |
| 7,983,038 B2 * | 7/2011 | Levesque et al. ............. 361/692 |
| 2002/0172013 A1 * | 11/2002 | Chandler ....................... 361/724 |
| 2002/0179548 A1 * | 12/2002 | Rinderer ........................ 211/26 |
| 2004/0020873 A1 * | 2/2004 | Henderson ..................... 211/26 |
| 2011/0012489 A1 * | 1/2011 | Shen et al. .................... 312/326 |

FOREIGN PATENT DOCUMENTS

JP   06008824 A   *   1/1994

* cited by examiner

*Primary Examiner* — Jonathan Liu
*Assistant Examiner* — Joshua Rodden
(74) *Attorney, Agent, or Firm* — Altis Law Group, Inc.

(57) ABSTRACT

A rack frame includes a bottom frame defining a first opening on an outer side, a strengthening board fixed on the bottom frame, and a strengthening leg fixed on the strengthening board. The strengthening board includes a baseboard and an upright board extending from a edge of the baseboard. The upright board defines a third opening. The upright board is fixed on the outer side of the bottom frame. The strengthening leg includes a diagonal supporting portion fixed on the baseboard, and a received portion horizontally extending from a top edge of the diagonal supporting portion. The received portion is received in the third and first openings. The diagonal supporting portion defines a fourth opening for fixing the strengthening leg on the strengthening board manually.

6 Claims, 5 Drawing Sheets

RACK FRAME

BACKGROUND

1. Technical Field

The disclosure generally relates to a rack frame, especially to a rack frame for supporting servers.

2. Description of Related Art

A typical rack frame for supporting servers usually includes a plurality of wheels at the bottom for moving the rack frame. However, the rack frame is unstable when moved by sliding the plurality of wheels on a floor.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
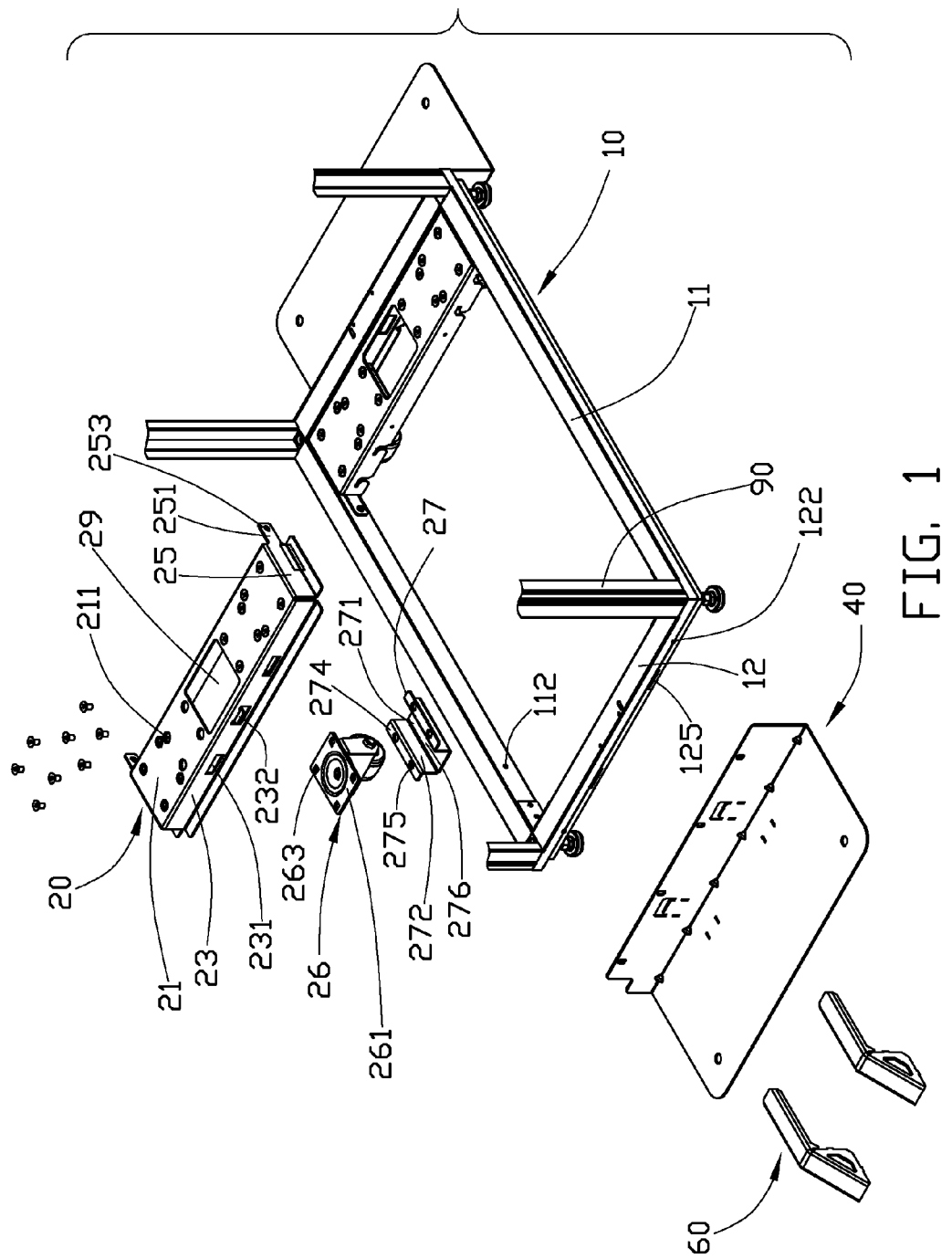
FIG. 1 is an exploded, isometric view of an embodiment of a rack frame.
Figure 2:
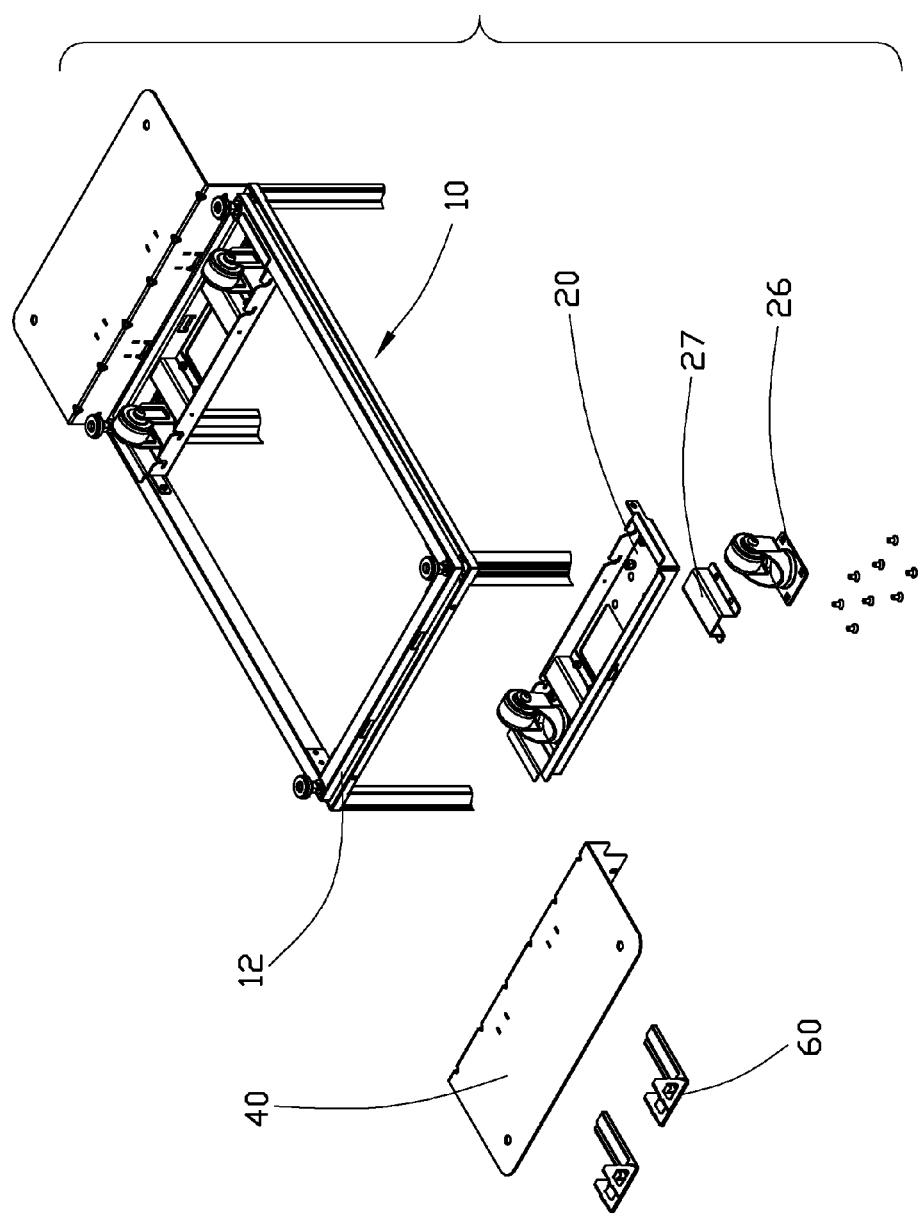
FIG. 2 is an exploded, isometric view of the embodiment shown in FIG. 1 viewed from another aspect.

Referring to FIGS. 1 and 2, a rack frame for supporting servers includes a rectangular bottom frame 10 and four support posts 90 fixed on four corners of the bottom frame 10. The bottom frame 10 includes a pair of first bars 11 and a pair of second bars 12. Each of the first bars 11 defines a plurality of first fixing holes 112 on an inner side. Each of the second bars 12 defines a plurality of first securing holes 122 on an outer side, and a pair of first openings 125. Each of the second bars 12 defines a locking hole (not shown) on an inner side between the first openings 125.

A pair of securing brackets 20 is fixed on the bottom frame 10. Each of the securing brackets 20 includes a horizontal base panel 21, a front panel 23 extending from a front edge of the base panel 21, and two side panels 25 extending from two edges of the base panel 21. The base panel 21 defines a plurality of second fixing holes 211. The front panel 23 defines a pair of second openings 231 corresponding to the pair of first openings 125. The front panel 23 defines a tongue vane 232 between the second openings 231. Each of the side panels 25 protrudes to form a securing portion 251. Each of the securing portions 251 defines a second securing hole 253. The base panel 21, the front panel 23 and the side panels 25 cooperatively form an accommodating space 29 therebetween.

A pair of wheels 26 is fixed in the accommodating space 29. Each of the wheels 26 includes a locking panel 261. The locking panel 261 defines four first threaded holes 263 on four corners. A restriction member 27 is fixed in the accommodating space 29. The restriction member 27 includes a base wall 271, a pair of sidewalls 272 extending from two edges of the base wall 271, and a pair of locking portions 274 horizontally extending from two upper edges of the sidewalls 272. Each of the locking portions 274 defines a second threaded hole 275. The base wall 271 and the sidewalls 272 cooperatively form a restriction space 276 therebetween.

Figure 3:
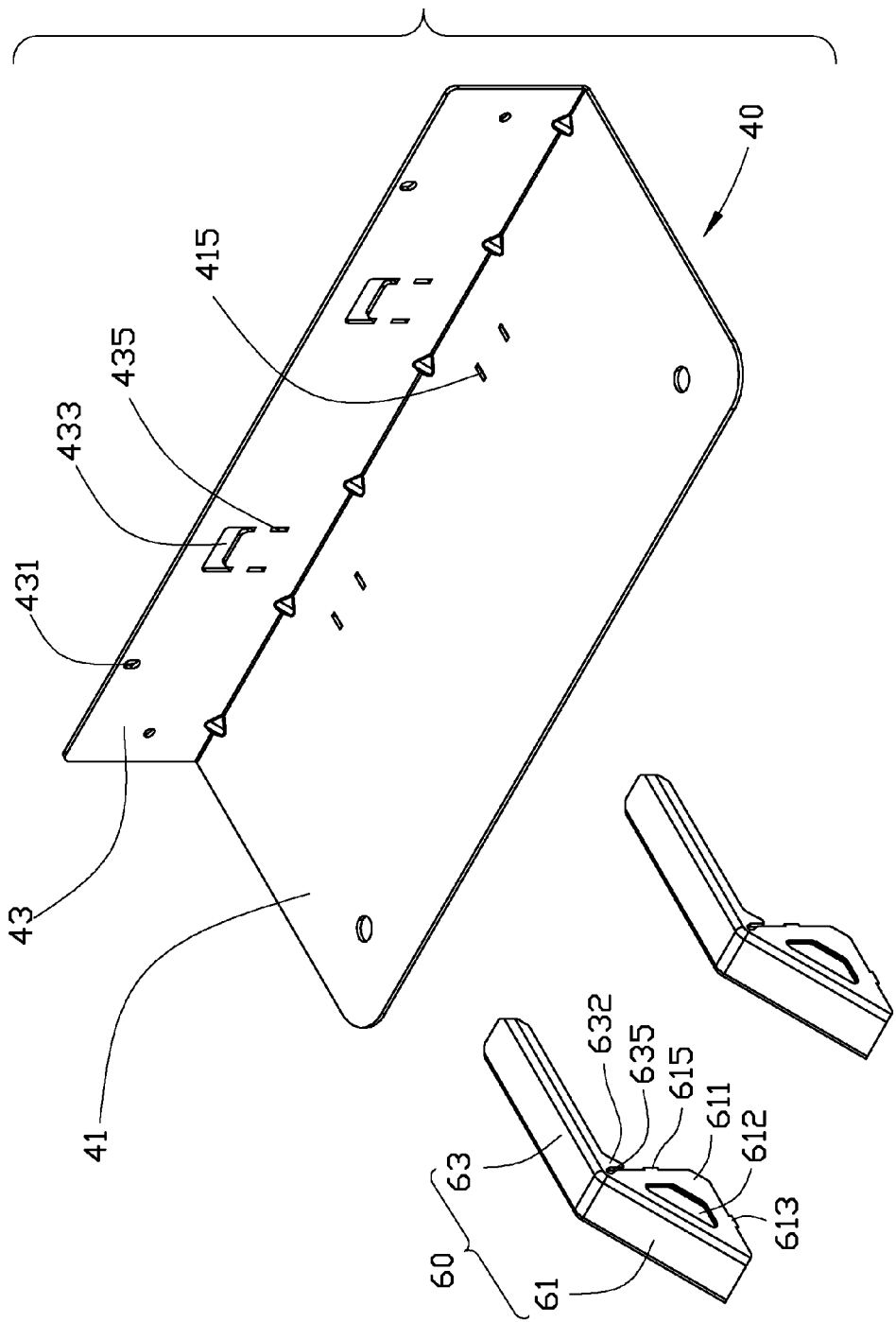
FIG. 3 is an assembled view of a securing board and supporting legs of FIG. 1.
Figure 4:
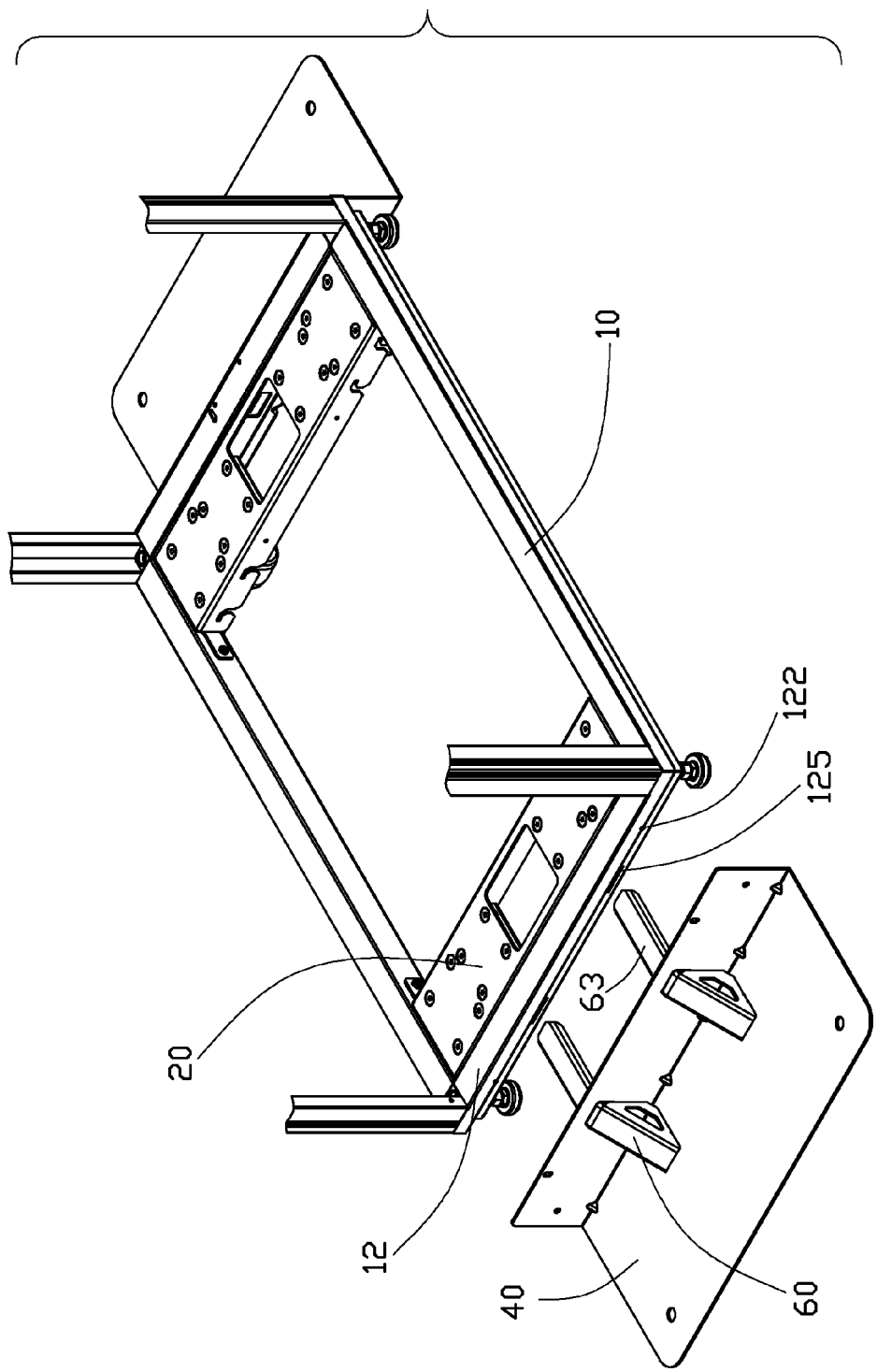
FIG. 4 is a partial assembled view of the embodiment of FIG. 1.
Figure 5:
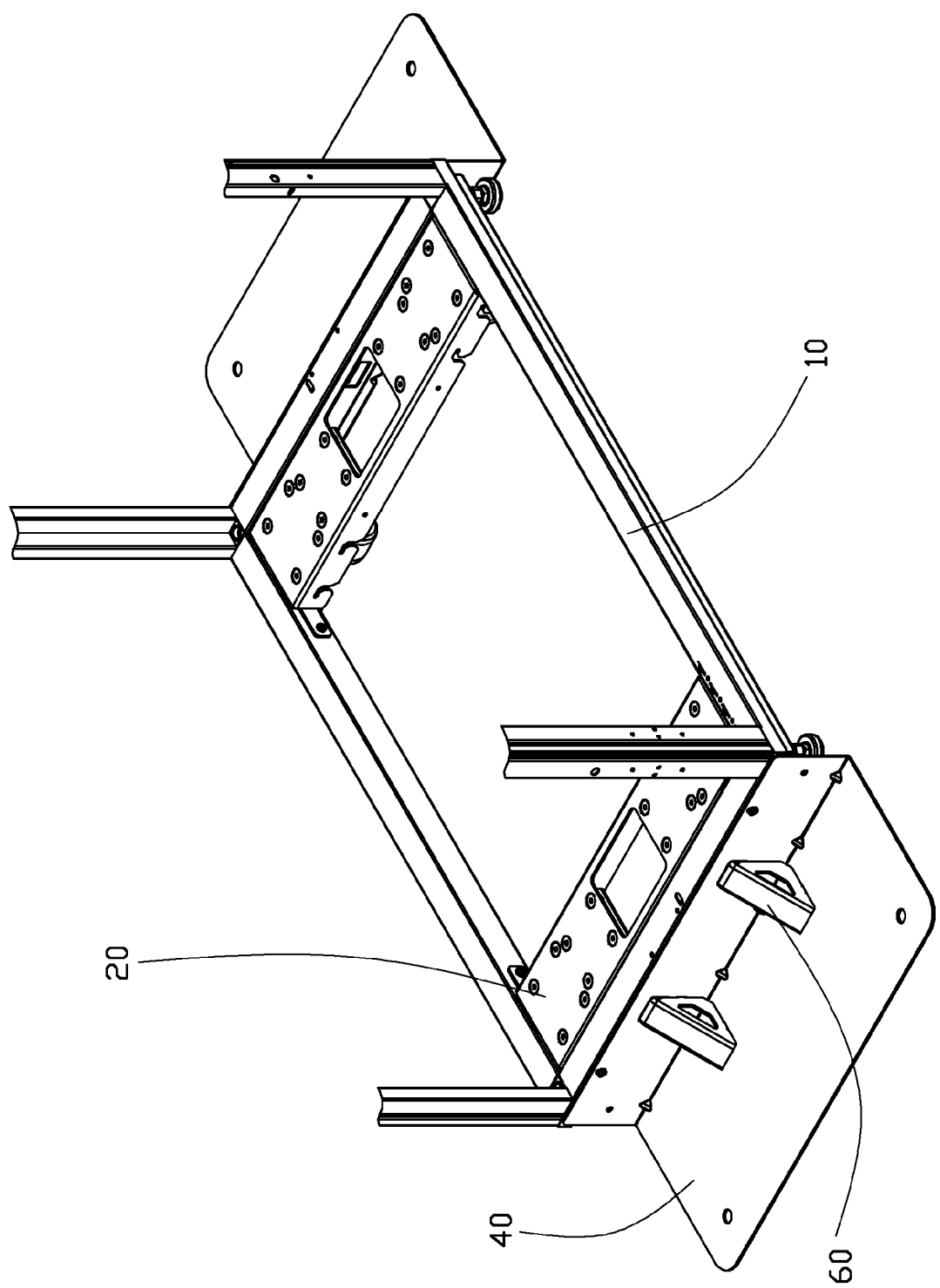
FIG. 5 is an assembled view of the embodiment of FIG. 1.

Referring to FIGS. 1 and 3, a strengthening board 40 is fixed on the outer side of the second bar 12. The strengthening board 40 includes a horizontal baseboard 41 and an upright board 43 extending from an edge of the baseboard 41. The upright board 43 defines a plurality of third fixing holes 431 corresponding to the plurality of first securing holes 122, a pair of third openings 433 corresponding to the pair of first openings 125, and a pair of first positioning slots 435 below each third opening 433. The baseboard 41 defines two pairs of second positioning slots 415 corresponding to the two pairs of first positioning slots 435.

Two strengthening legs 60 are fixed on the strengthening board 40. Each of the strengthening legs 60 includes a diagonal supporting portion 61 and a received portion 63 horizontally extending from a top edge of the supporting portion 61. Each of the supporting portions 61 includes a pair of triangular supporting vanes 611 on two sides. Each of the supporting vanes 611 defines a second positioning vane 613 at the bottom corresponding to the second positioning slots 415, and a first positioning vane 615 corresponding to the first positioning slots 435. Each of the received portions 63 defines a pair of protrusion portions 632 adjacent to the supporting vanes 611. Each of the protrusion portions 632 and the corresponding supporting vanes 611 cooperatively form a gap 635 therebetween. Each of the supporting vanes 611 defines a fourth opening 612 for fixing the strengthening legs 60 on the strengthening board 40 manually. In one embodiment, the fourth openings 612 are trapezoidal.

Referring to FIGS. 1 to 5, in assembly, the locking panels 261 of the wheels 26 are accommodated in the accommodating space 29. The locking panels 261 join together with the base panel 21 and the first threaded holes 263 are aligned with the second fixing holes 211. A plurality of fastening members (not labeled) pass through the corresponding first threaded holes 263 and the second fixing holes 211 to fix the wheels 26 on the securing brackets 20. The restriction members 27 are accommodated in the accommodating space 29. The locking portions 274 join together with the base panel 21. The second threaded holes 275 are aligned with the second fixing holes 211. A plurality of fastening members pass through the corresponding second threaded holes 275 and the second fixing holes 211 to fix the restriction members 27 on the securing brackets 20. The restriction space 276 is aligned with the second openings 231.

The securing brackets 20 are fixed between the pair of first bars 11. The side panels 25 are aligned with the inner side of the pair of first bars 11. The tongue vanes 232 are received in the corresponding locking holes. The second securing holes 253 are aligned with the first fixing holes 112. A plurality of fastening members pass through the corresponding second securing holes 253 and the first fixing holes 112 to fix the securing brackets 20 on the bottom frame 10. The pair of second openings 231 is aligned with the pair of first openings 125.

The fourth openings 612 of the supporting portions 61 are held to fix the strengthening legs on the strengthening board 40. The received portions 63 are received in the corresponding third openings 433, and edges of the third openings 433 are received in the corresponding gaps 635. The first positioning vanes 615 are received in the corresponding first positioning slots 435. The second positioning vanes 613 are received in the corresponding second positioning slots 415. The received portions 63 are received in the corresponding first openings 125, the second openings 231, and the restriction spaces 276. The third fixing holes 431 are aligned with the first securing holes 122. A plurality of fastening members pass through the corresponding third fixing holes 431 and the first securing holes 122 to fix the strengthening boards 40 on the securing brackets 20. When the rack frame is removed by the wheels 26, a height of the baseboards 41 exceeds that of the locking panels 261. Therefore, the rack frame is more stable.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A rack frame comprising:
   a bottom frame defining a first opening on an outer side;
   a strengthening board fixed on the bottom frame, the strengthening board comprising:
   a baseboard; and
   an upright board extending from an edge of the baseboard; the upright board defines a third opening; and the upright board is fixed on the outer side of the bottom frame; and
   a strengthening leg fixed on the strengthening board, the strengthening leg comprising:
   a diagonal supporting portion fixed on the baseboard; and
   a received portion horizontally extending from a top edge of the diagonal supporting portion; the received portion is able to be received in the third and first openings; and the diagonal supporting portion defines a fourth opening configured for fixing the strengthening leg on the strengthening board by hand; wherein the diagonal supporting portion of the strengthening leg defines a supporting vane on one side; the fourth opening is trapezoidal and defined in the supporting vane; the supporting vane defines a first positioning vane toward the received portion, and a second positioning vane at the bottom; the upright board defines a first positioning slot for receiving the first positioning vane; and the baseboard defines a second positioning slot for receiving the second positioning vane.

2. The rack frame of claim 1, wherein the received portion defines a protrusion portion adjacent to the supporting vane; the protrusion portion and the supporting vane cooperatively define a gap therebetween; and an edge of the third opening is configured to engage with the gap.

3. The rack frame of claim 1, wherein a securing bracket is fixed on an inner side of the bottom frame; the securing bracket defines a second opening; and the received portion is configured to be inserted in the second opening.

4. The rack frame of claim 3, wherein a restriction member is fixed on the securing bracket; the restriction member defines a restriction space; the restriction space is configured to align with the second opening; and the received portion is configured to be received in the restriction space.

5. The rack frame of claim 3, wherein a plurality of wheels are fixed on the bottom frame; a height of the baseboard exceeds that of the plurality of wheels slightly; the securing bracket comprises a horizontal base panel, and two side panels extending from two edges of the horizontal base panel; the horizontal base panel defines a plurality of fixing holes for fixing the plurality of wheels; and the two side panels are fixed on the bottom frame.

6. The rack frame of claim 5, wherein the securing bracket further comprises a front panel extending from a front edge of the horizontal base panel; the front panel defines a tongue vane; the bottom frame defines a locking hole; and the tongue vane is configured to be inserted in the locking hole.

* * * * *